United States Patent
Hu et al.

(10) Patent No.: US 11,115,042 B1
(45) Date of Patent: Sep. 7, 2021

(54) LOW PASS FILTER EMBEDDED DIGITAL-TO-ANALOG CONVERTER

(71) Applicant: Beken Corporation, Shanghai (CN)

(72) Inventors: Desheng Hu, Shanghai (CN); Jiazhou Liu, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 16/952,294

(22) Filed: Nov. 19, 2020

(30) Foreign Application Priority Data

Oct. 9, 2020 (CN) .......................... 202011073672.7

(51) Int. Cl.
*H03M 1/66* (2006.01)
*H03M 1/68* (2006.01)
*H03M 1/76* (2006.01)

(52) U.S. Cl.
CPC ............... *H03M 1/68* (2013.01); *H03M 1/76* (2013.01)

(58) Field of Classification Search
CPC .................................. H03M 1/68; H03M 1/76

USPC .......................... 341/143, 155, 144, 150, 172
See application file for complete search history.

(56) References Cited

U.S. PATENT DOCUMENTS

| | | | | | |
|---|---|---|---|---|---|
| 6,147,522 | A | * | 11/2000 | Rhode | ................... H03M 3/368 327/93 |
| 6,154,162 | A | * | 11/2000 | Watson | ............... H03M 1/0673 341/144 |
| 2009/0252252 | A1 | * | 10/2009 | Kim | ....................... H03D 7/166 375/268 |

* cited by examiner

*Primary Examiner* — Peguy Jean Pierre
(74) *Attorney, Agent, or Firm* — Schwegman Lundberg & Woessner, P.A.

(57) ABSTRACT

A low pass filter embedded digital-to-analog converter including a first switch coupled to a first node that is coupled to a fourth switch and a first capacitor, a second switch coupled to a second node that is coupled to the first capacitor and a third switch, a negative input of a first operational amplifier coupled to a third node that is coupled to the third switch and a second capacitor, and an output port of the first operational amplifier coupled to a fourth node that is coupled to the second capacitor and the fourth switch.

9 Claims, 9 Drawing Sheets

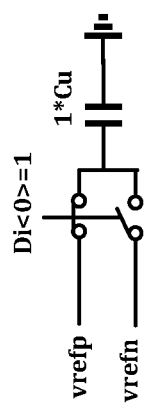
FIG. 7A
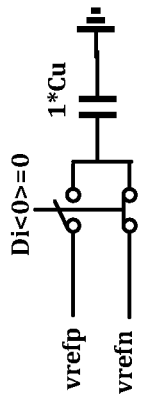
FIG. 7B
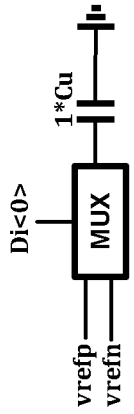
FIG. 7C
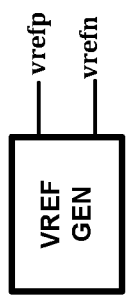

LOW PASS FILTER EMBEDDED DIGITAL-TO-ANALOG CONVERTER

CROSS REFERENCE TO RELATED APPLICATION

This application claims priority to and incorporates by reference in its entirety Chinese patent application no. 202011073672.7, filed Oct. 9, 2020.

TECHNICAL FIELD

The present disclosure generally relates to digital-to-analog converter with embedded low pass filters, and methods for generating a low-pass filtered analog signal via a low pass filter embedded digital-to-analog converter.

BACKGROUND

A digital-to-analog converter is a system that converts a digital signal into an analog signal, which drives a variety of electronic devices. Traditional types of digital-to-analog converters do not support high-speed data transmission, such as data transmission in a WiFi environment. In order to support high-speed data transmission and high-bit digital input, current source digital-to-analog converters are widely used. However, one of the downsides of current source digital-to-analog converters is that the footprint is relatively abundant on integrated circuits or printed circuit boards, especially when it is designed to support high-bit digital input. Therefore, reducing the footprint of digital-to-analog converters while supporting high speed and high-bit data processing is one of the technical hurdles as technology advances.

SUMMARY

An embodiment provides a circuit comprising a first switch coupled to a first node that is coupled to a fourth switch and a first capacitor, a second switch coupled to a second node that is coupled to the first capacitor and a third switch, a negative input of a first operational amplifier coupled to a third node that is coupled to the third switch and a second capacitor, and an output port of the first operational amplifier coupled to a fourth node that is coupled to the second capacitor and the fourth switch.

In an embodiment of the circuit, a parallel array of binary-weighted linear capacitors is coupled between the first node and the second node.

In an embodiment of the circuit, the circuit is a 12-bit digital-to-analog converter.

In an embodiment of the circuit, the circuit is a single-ended analog signal outputting digital-to-analog converter.

An embodiment provides a circuit comprising a first switch coupled to a first node that is coupled to a fourth switch and a first capacitor, a second switch coupled to a first voltage of common mode and a second node that is coupled to the first capacitor and a third switch, a positive input port of a second operational amplifier coupled to a third node that is coupled to the third switch and a second capacitor, a negative output port of the second operational amplifier coupled to a fourth node that is coupled to the second capacitor and the fourth switch, a fifth switch coupled to a fifth node that is coupled to a third capacitor and an eighth switch, a sixth switch coupled to the first voltage of common mode and a sixth node that is coupled to the third capacitor and a seventh switch, a negative input port of the second operational amplifier coupled to a seventh node that is coupled to the seventh switch and a fourth capacitor, and a positive output port of the second operational amplifier coupled to an eighth node that is coupled to the fourth capacitor and the eighth switch.

In an embodiment of the circuit, a second voltage of common mode is coupled between the positive input port and the negative input port of the second operational amplifier.

In an embodiment of the circuit, a first parallel array of binary-weighted linear capacitors is coupled between the first node and the second node, a second parallel array of binary-weighted linear capacitors is coupled between the fifth node and the sixth node.

In an embodiment of the circuit, the circuit is a 12-bit digital-to-analog converter.

In an embodiment of the circuit, the circuit is a fully differential analog signal outputting digital-to-analog converter.

An embodiment provides a method comprising receiving, by a digital-to-analog converter, a digital signal, converting, by the digital-to-analog converter, the received digital signal to an analog signal, filtering, by an embedded low pass filter in the digital-to-analog converter, the analog signal to remove a signal having a frequency higher than a predetermined threshold, outputting the filtered analog signal.

In an embodiment of the method, the digital-to-analog converter comprises a first switch coupled to a first node that is coupled to a fourth switch and a first capacitor, a second switch coupled to a second node that is coupled to the first capacitor and a third switch, a negative input of a first operational amplifier coupled to a third node that is coupled to the third switch and a second capacitor, and an output port of the first operational amplifier coupled to a fourth node that is coupled to the second capacitor and the fourth switch.

In an embodiment of the method, a parallel array of binary-weighted linear capacitors is coupled between the first node and the second node.

In an embodiment of the method, the digital-to-analog converter is a 12-bit digital-to-analog converter.

In an embodiment of the method, the digital-to-analog converter outputs a single-ended analog signal.

In an embodiment of the method, the digital-to-analog converter comprises a first switch coupled to a first node that is coupled to a fourth switch and a first capacitor, a second switch coupled to a first voltage of common mode and a second node that is coupled to the first capacitor and a third switch, a positive input port of a second operational amplifier coupled to a third node that is coupled to the third switch and a second capacitor, a negative output port of the second operational amplifier coupled to a fourth node that is coupled to the second capacitor and the fourth switch, a fifth switch coupled to a fifth node that is coupled to a third capacitor and an eighth switch, a sixth switch coupled to the first voltage of common mode and a sixth node that is coupled to the third capacitor and a seventh switch, a negative input port of the second operational amplifier coupled to a seventh node that is coupled to the seventh switch and a fourth capacitor, and a positive output port of the second operational amplifier coupled to an eighth node that is coupled to the fourth capacitor and the eighth switch.

In an embodiment of the method, a second voltage of common mode is coupled between the positive input port and the negative input port of the second operational amplifier.

In an embodiment of the method, a first parallel array of binary-weighted linear capacitors is coupled between the first node and the second node, a second parallel array of binary-weighted linear capacitors is coupled between the fifth node and the sixth node.

In an embodiment of the method, the digital-to-analog converter is a 12-bit digital-to-analog converter.

In an embodiment of the method, the digital-to-analog converter outputs a fully differential analog signal.

BRIEF DESCRIPTION OF THE DRAWINGS

Non-limiting and non-exhaustive embodiments are described with reference to the following figures, wherein like reference numerals refer to like parts throughout the various views unless otherwise specified.

FIGS. 7A-7C are circuit diagrams of equivalent circuits of a digital-to-analog converter of 1-bit digital input in sampling phase according to an embodiment.

DETAILED DESCRIPTION

Various aspects and examples will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

Figure 1:
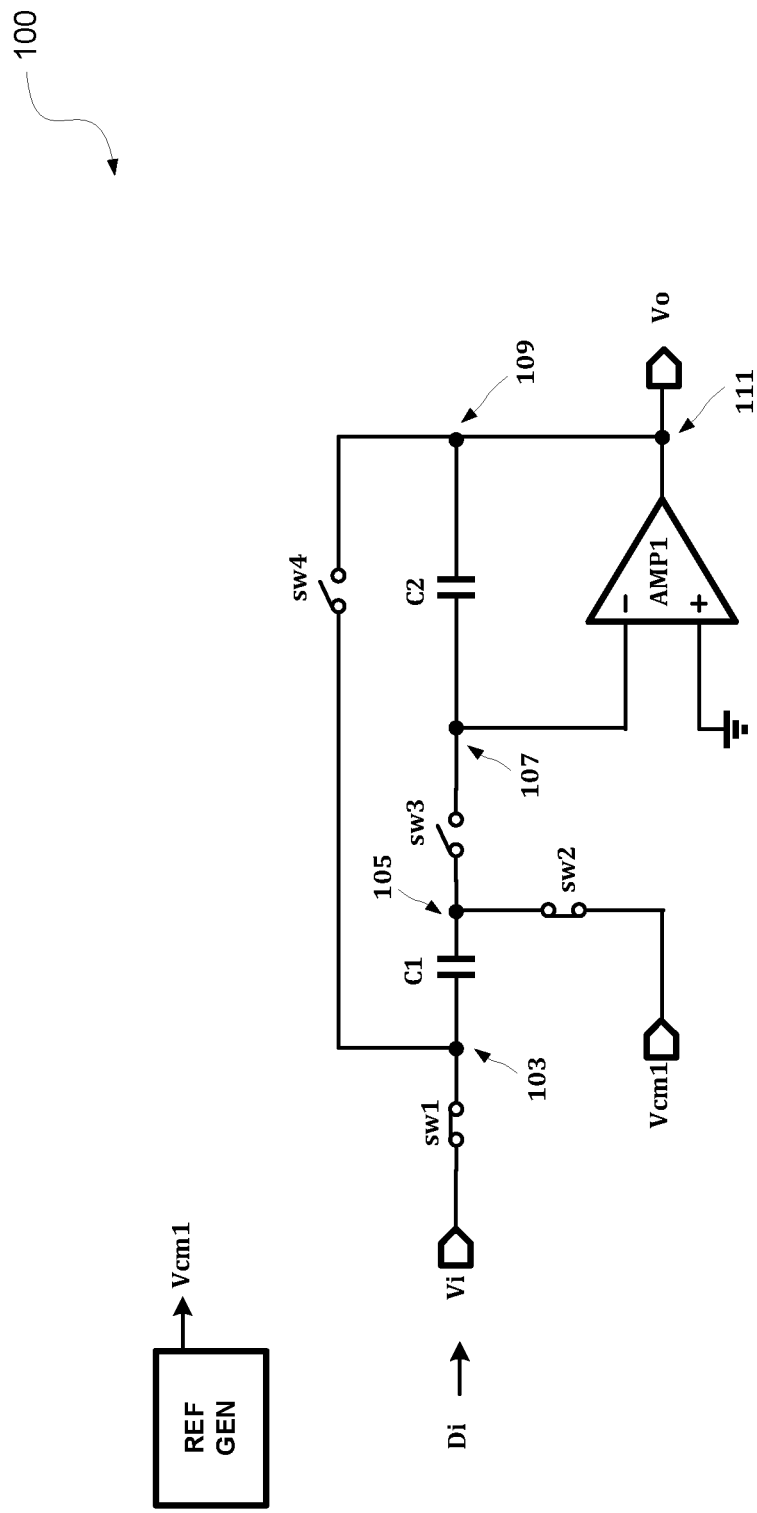
FIG. 1 is a circuit diagram of a digital-to-analog converter outputting a single-ended analog signal in sampling phase according to an embodiment.

FIG. 1 is a circuit diagram of a digital-to-analog converter outputting a single-ended analog signal in sampling phase according to an embodiment. In some embodiments, a digital-to-analog converter 100 comprises a first capacitor C1, a second capacitor C2, a first switch sw1, a second switch sw2, a third switch sw3, a fourth switch sw4, and an operational amplifier AMP1.

The first switch SW1 is coupled to the first node 103 that is coupled to the fourth switch sw4 and the first capacitor C1. The second switch sw2 is coupled to the second node 105 that is coupled to the first capacitor C1 and the third switch sw3. The negative input of the first operational amplifier AMP1 is coupled to the third node 107 that is coupled to the third switch sw3 and the second capacitor C2. The output port of the first operational amplifier AMP1 is coupled to the fourth node 109 that is coupled to the second capacitor C2 and the fourth switch sw4. A reference voltage Vcm1 generated by a reference generator REF GEN is coupled to the opposite end of the second switch sw2 connecting the second node 105. The digital input Di is coupled to the opposite end of the first switch sw1 connecting the first node 103. The digital input Di converts to a digital voltage input Vi via an equation:

$$Vi = Di * k \text{ (k is a constant)}$$

Figure 3B:
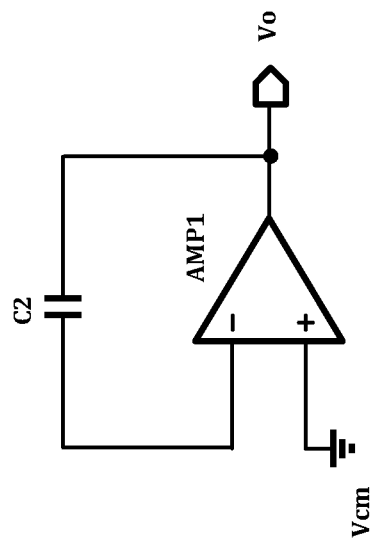
FIGS. 3A-3B are circuit diagrams of equivalent circuits to a digital-to-analog converter outputting single-ended analog signal or fully differential analog signal in sampling phase, respectively, according to an embodiment.
Figure 3A:
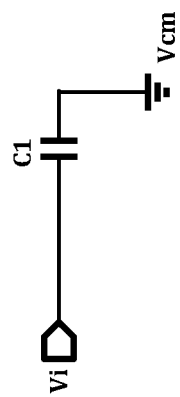

The digital-to-analog converter 100 is in sampling phase when the first switch sw1 and the second switch sw2 are closed, while the third switch sw3 and the fourth switch sw4 are open. During sampling phase, the electric charge associated with the digital voltage input Vi accumulates on the first capacitor C1, whereas the electric charge associated with an existing voltage in the circuit 100 holds still on the second capacitor C2. Referring to FIG. 3A and FIG. 3B, a person of ordinary skill in the art shall appreciate that FIG. 3A and FIG. 3B are the equivalent circuits of the circuit 100 in FIG. 1 during sampling phase. Specifically, during sampling phase, when switches sw1 and sw2 are closed and the switches sw3 and sw4 are open, the digital voltage input Vi flows via the closed sw1 and sw2 through the first capacitor C1 to a voltage of common mode, which is a DC ground. The digital voltage input Vi does not flow through C2 or AMP1 because switches sw3 and sw4 remains open.

The total electric charge Q1 in the circuit 100 during sampling phase is calculated based on an equation:

$$Q1 = Vi(n) * C1 + Vo(n) * C2$$

Figure 2:
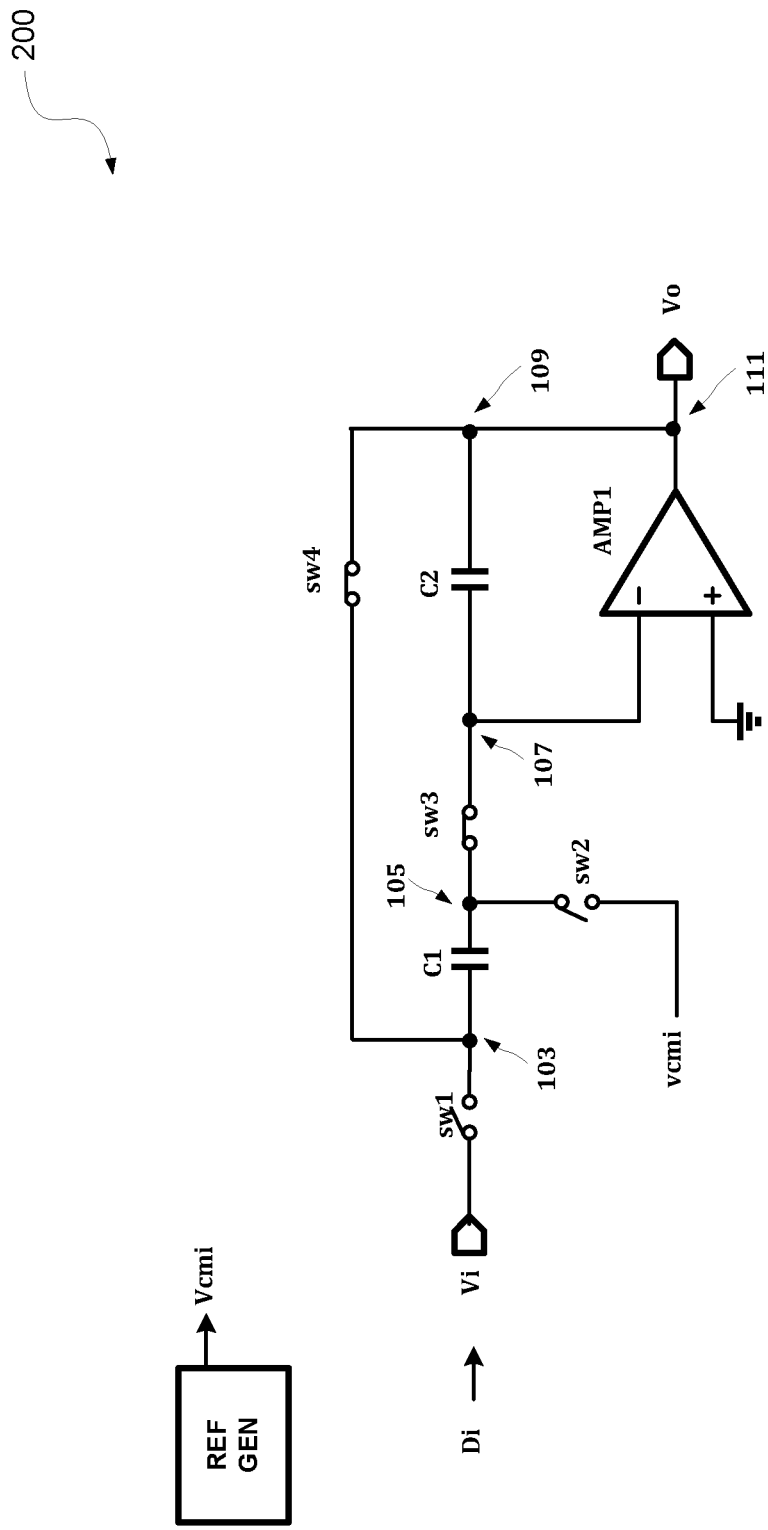
FIG. 2 is a circuit diagram of a digital-to-analog converter outputting single-ended analog signal in conversion phase according to an embodiment.

FIG. 2 is a circuit diagram of a digital-to-analog converter outputting a single-ended analog signal in conversion phase according to an embodiment. The circuits 100 and 200 of the digital-to-analog converter output a single-ended analog signal via the output port 111 corresponding to an output voltage Vo.

Figure 4:
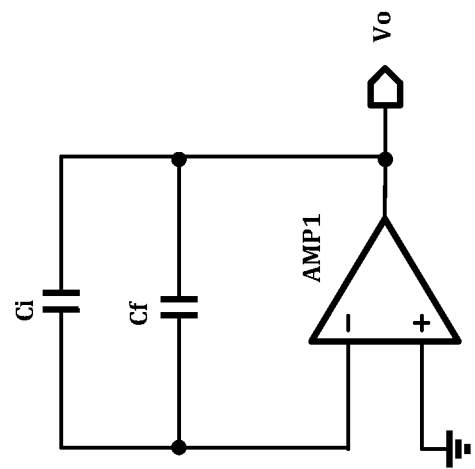
FIG. 4 is a circuit diagram of an equivalent circuit of a digital-to-analog converter outputting single-ended analog signal or fully differential analog signal in conversion phase according to an embodiment.

In some embodiments, the digital-to-analog converter 200 operates as the digital-to-analog converter 100 in conversion phase. During the conversion phase, the third switch sw3 and the fourth switch sw4 are closed, whereas the first switch sw1 and the second switch sw2 are open. Referring to FIG. 4, a person of ordinary skill in the art shall appreciate that FIG. 4 is the equivalent circuit of the circuit 200 in FIG. 2 when the third switch sw3 and the fourth switch sw4 are closed, while the first switch sw1 and the second switch sw2 are open. In FIG. 4, when the digital-to-analog converter outputs a single-ended signal, the value of the input capacitor Ci equals to the value of the first capacitor and the value of the Cf equals to the value of the second capacitor C2. C1 carrying the previously accumulated electric charge associated with the digital voltage input Vi is coupled to the second capacitor C2 carrying the previously held electric charge associated with the existing voltage in the circuit 100. The total electric charge Q2 during conversion phase is calculated based on an equation:

$$Q2 = Vo(n+1) * (C1 + C2)$$

Based on the law of charge conservation, the differential equation in digital discrete domain, i.e. Z domain, is $Vi*C1 + Vo*C2 = Vo*(C1+C2)*z$.

The respective transfer function is $H(z) = C1/[(C1+C2)*z - C2]$ (z is an independent variable in Z domain). The transfer function can be simplified as $H(z) = 1/(2*z-1)$ when the value of C1 equals to the value of C2. The simplified transfer function indicates a hypothetical existence of a low pass filter embedded in the circuits 100 and 200 without a physical low pass filter being built into the circuits. Therefore, the circuit design in the present application significantly saves the footprint of a high bit digital-to-analog converter (e.g., 12-bit digital-to-analog converter) on integrated circuits or printed circuit boards. The bandwidth of the low pass filter can be adjusted by defining the values of the first capacitor C1 and the second capacitor C2 being the variables in the equations.

FIG. 1 and FIG. 2 show a digital-to-analog conversion with single-digit input (e.g. Di[1:0]). A person of ordinary skill in the art shall appreciate that C1 may be replaced by a parallel array of 12-pair binary-weighted linear capacitors (not shown) coupled between the first node 103 and the second node 105 to allow the digital-to-analog converter to provide a higher digit resolution. For example, an array comprising a parallel array of 12-pair binary-weighted linear capacitors may allow the digital-to-analog converter to receive a 12-bit digital input (e.g. Di[11:0]) to achieve a 12-bit high digit resolution.

The digital voltage input Vi is a sine wave with peak to peak voltage and clock signal respectively. During the ON period of clock, sampling of digital voltage input Vi via the first capacitors C1 and holding of the existing circuit voltage via the second capacitor C2 take place. During the OFF period of clock, the conversion from a digital signal to an analog signal takes place where the sampled value held by the first capacitor C1 is coupled to the held value by the second capacitor C2, and is applied to the input port of the first operational amplifier input AMP1.

FIGS. 3A-3B are circuit diagrams of equivalent circuits of a digital-to-analog converters outputting single-ended analog signal or fully differential analog signal in sampling phase, respectively, according to an embodiment. As recited previously, FIG. 1 and FIG. 2, a person of ordinary skill in the art shall appreciate that FIG. 3A and FIG. 3B are the equivalent circuits of the circuit 100 in FIG. 1 during sampling phase.

FIG. 4 is a circuit diagram of an equivalent circuit of a digital-to-analog converter outputting a single-ended analog signal or a fully differential analog signal in conversion phase according to an embodiment. A person of ordinary skill in the art shall appreciate that FIG. 4 is the equivalent circuit of the circuit 200 in FIG. 2 during conversion phase.

Figure 5:
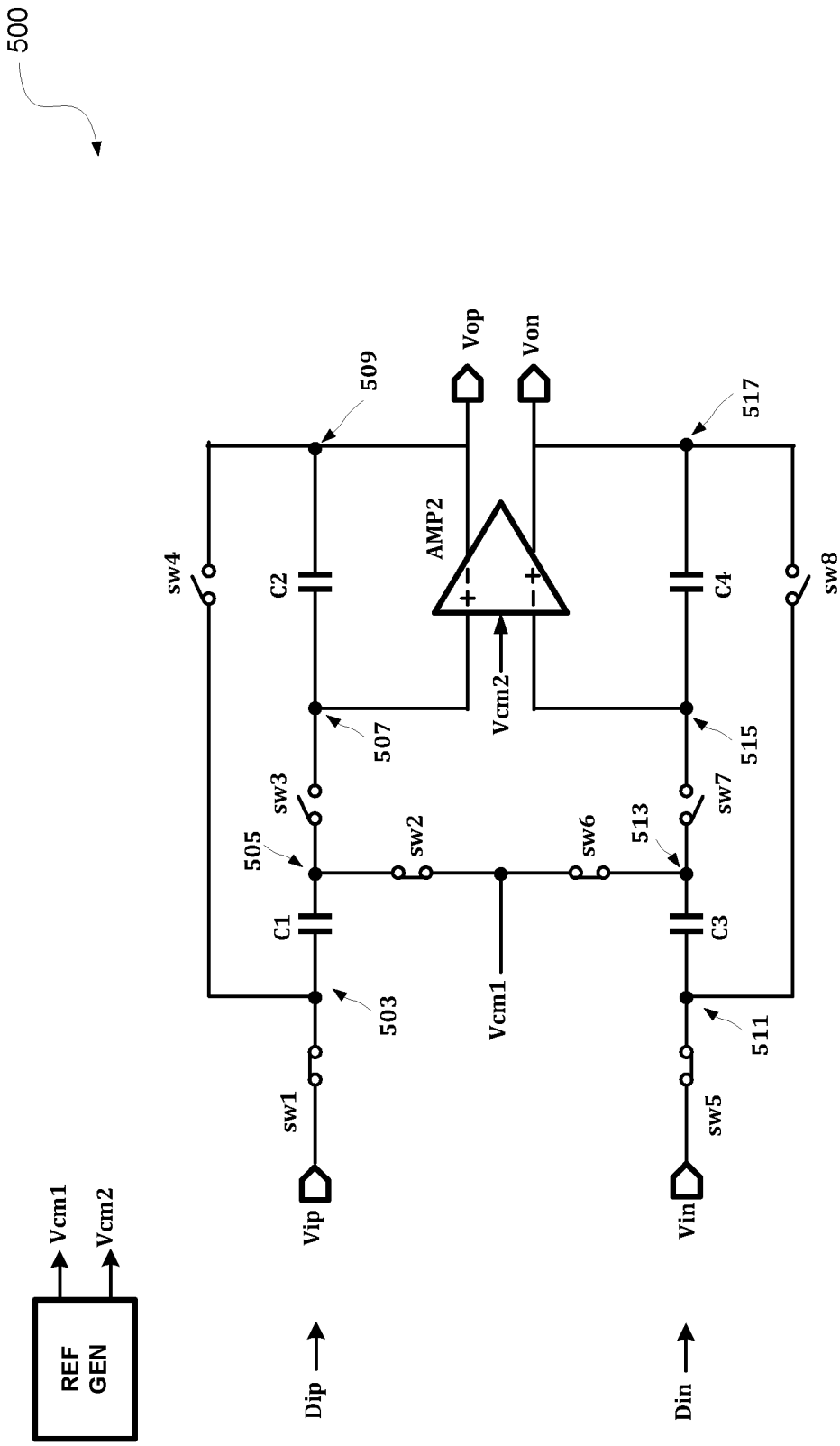
FIG. 5 is a circuit diagram of a digital-to-analog converter outputting fully differential analog signals in sampling phase according to an embodiment.

FIG. 5 is a circuit diagram of a digital-to-analog converter 500 outputting a fully differential analog signal in sampling phase according to an embodiment. The digital-to-analog converter 500 comprises a first capacitor C1, a second capacitor C2, a third capacitor C3, a fourth capacitor C4, a first switch sw1, a second switch sw2, a third switch sw3, a fourth switch sw4, a fifth switch sw5, a sixth switch sw6, a seventh switch sw7, an eighth switch sw8, and an operational amplifier AMP2. The first switch sw1 is coupled to a first node 503 that is coupled to the fourth switch sw4 and the first capacitor C1. The second switch sw2 is coupled to a first voltage of common mode Vcm1 and the second node 505 that is coupled to the first capacitor C1 and the third switch sw3. The positive input port of a second operational amplifier AMP2 is coupled to the third node 507 that is coupled to the third switch sw3 and the second capacitor C2. The negative output port of the second operational amplifier AMP2 is coupled to the fourth node 509 that is coupled to the second capacitor C2 and the fourth switch sw4. The fifth switch sw5 is coupled to a fifth node 511 that is coupled to the third capacitor C3 and the eighth switch sw8. The sixth switch sw6 is coupled to the first voltage of common mode Vcm1 and the sixth node 513 that is coupled to the third capacitor C3 and the seventh switch sw7. The negative input port of the second operational amplifier AMP2 is coupled to the seventh node 515 that is coupled to the seventh switch sw7 and the fourth capacitor C4. The positive output port of the second operational amplifier AMP2 is coupled to the eighth node 517 that is coupled to the fourth capacitor C4 and the eighth switch sw8.

The second voltage of common mode Vcm2 is generated from the reference generator REF GEN and is coupled between the positive input port and the negative input port of the second operational amplifier AMP2. In some embodiments, the value of the voltage of common mode Vcm1 may equal to or may be different from the value of the voltage of common mode Vcm2. In some embodiments, $Vcm2=\frac{1}{2}*Vop/Von$.

Figure 6:
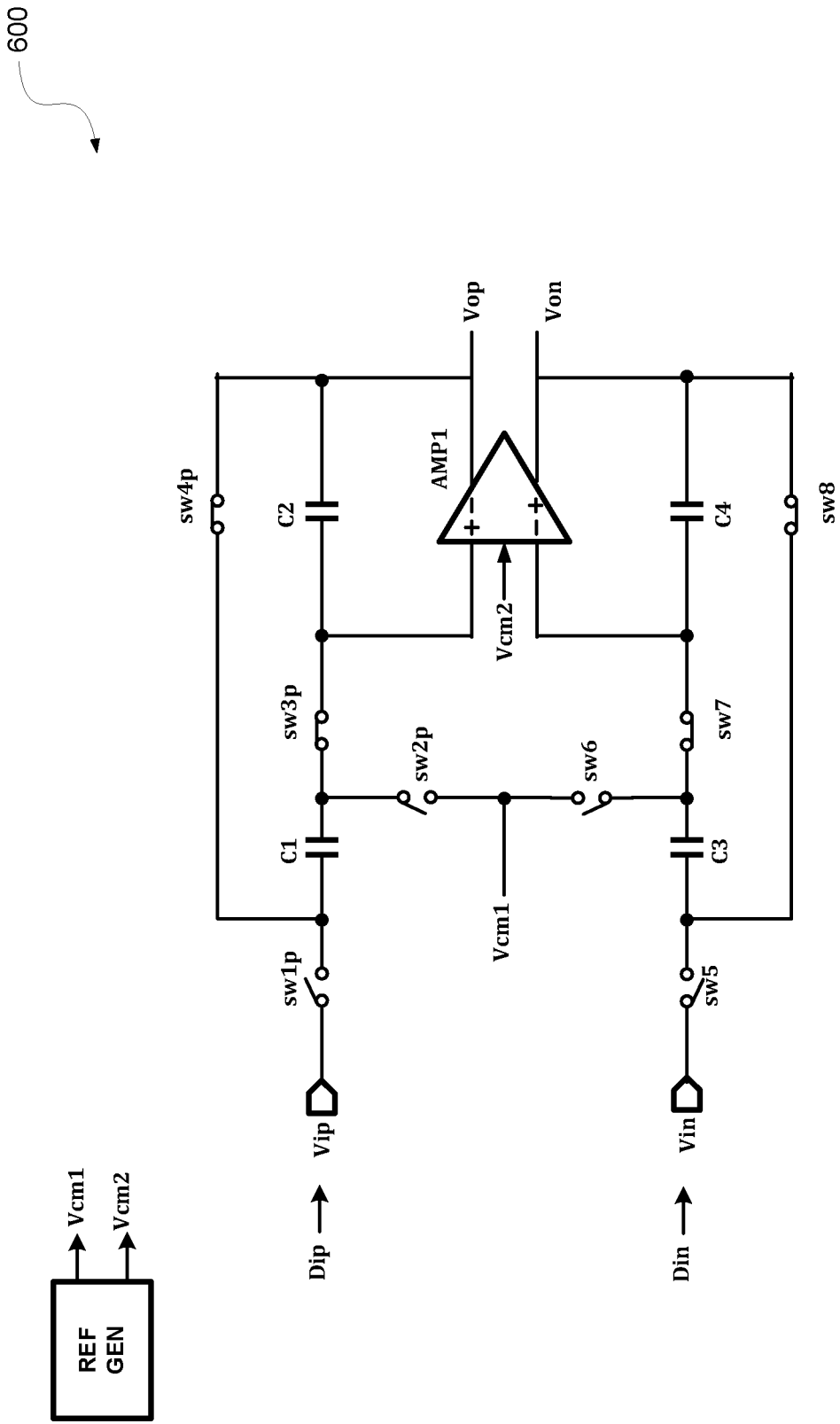
FIG. 6 is a circuit diagram of a digital-to-analog converter outputting fully differential analog signals in conversion phase according to an embodiment.

FIG. 5 and FIG. 6 show a digital-to-analog conversion with single-digit input (e.g. Di[1:0]). A person of skill in the art shall appreciate that C1 and C3 may each be replaced by a parallel array of binary-weighted linear capacitors (not shown) to allow the digital-to-analog converter to achieve a higher digit resolution. For example, a parallel array of 12-pair binary-weighted linear capacitors replacing each of the C1 and C3 may allow the digital-to-analog converter to receive a 12-bit digital input (e.g. Di[11:0]) to achieve a 12-bit resolution. In some embodiments, a first array replacing the first capacitor C1 may be coupled between the first node 503 and the second node 505, and a second array replacing the third capacitor C3 may be coupled between the fifth node 511 and the sixth node 513.

The digital negative input Din is coupled to the opposite end of the first switch sw1 connecting the first node 103. The digital positive input Dip is coupled to the opposite end of the fifth switch sw5 connecting the fifth node 511. The digital inputs Din and Dip respectively correspond to the digital voltage positive input Vip and a digital voltage negative input Vin via equations:

$Vip=Dip*k; Vin=Din*k$ ($k$ is a constant)

The digital-to-analog converter 500 is in sampling phase when the first switch sw1, the second switch sw2, the fifth switch sw5, and the sixth switch sw6 are closed, while the third switch sw3, the fourth switch sw4, the seventh switch sw7, and the eighth switch sw8 are open. During sampling phase, the electric charge associated with the digital voltage positive input Vip accumulates on the first capacitor C1, while the electric charge associated with an existing voltage in the circuit 500 holds still on the second capacitor C2. The electric charge associated with the digital voltage negative input Vin accumulates on the third capacitor C3, while the electric charge associated with the existing voltage in the circuit 500 holds still on the fourth capacitor C4.

Referring to FIGS. 7A-7C, a person of ordinary skill in the art shall appreciate that FIGS. 7A-7C are equivalent circuits of the circuit 500 in FIG. 1 during sampling phase. In FIGS. 7A-7C, Cu is referred to as a unit capacitor. When the digital input is 1-bit, $C1=C3=2*Cu$. When the digital input is N-bit, $C1=C3=2^N*Cu$.

Compared to the single ended signal outputting circuit 100, the total electric charge Q1 in the fully differential signal outputting circuit 500 during sampling phase is similarly calculated based on the equation:

$Q1=Vi(n)*Ci+Vo(n)*Cf; Ci=C1=2^N*Cu; Cf=Ci$
$(C3=C1, C2=C4)$

FIG. 6 is a circuit diagram of a digital-to-analog converter 600 outputting a fully differential analog signal in conversion phase according to an embodiment. The circuits 500 and 600 of the digital-to-analog converter output a fully differential analog signal corresponding to the output voltages Vop and Von. In some embodiments, the digital-to-analog converter 600 is the digital-to-analog converter 100 in conversion phase. During the conversion phase, the first switch sw1, the second switch sw2, the fifth switch sw5, and the sixth switch sw6 are open, while the third switch sw3, the fourth switch sw4, the seventh switch sw7, and the eighth switch sw8 are closed. Referring back to FIG. 4, a person of ordinary skill in the art shall appreciate that FIG. 4 is the equivalent circuit of the circuit 600 in FIG. 6 during conversion phase. The total electric charge Q2 in the circuit 600 during conversion phase is similarly calculated based on an equation:

$$Q2=Vo(n+1)*(Ci+Cf)$$

Based on the law of charge conservation, the differential equation in the digital discrete domain, i.e. Z domain, is $Vi*Ci+Vo*Cf=Vo*(Ci+Cf)*z$.

The respective transfer function is $H(z)=Ci/[(Ci+Cf)*z-Cf]$ (z is an independent variable in Z domain). The transfer function can be simplified as $H(z)=1/(2*z-1)$ when the value of Ci equals to Cf. The simplified transfer function indicates a hypothetical existence of a low pass filter embedded in the circuits 500 and 600 without a physical low pass filter being built into the circuits. The bandwidth of the embedded low pass filter can be adjusted by defining the values of Ci and Cf via adjusting the respective values of the first capacitor C1, the second capacitor C2, the fifth capacitor sw5, and the sixth capacitor sw6.

FIGS. 7A-7C are circuit diagrams of equivalent circuits of a digital-to-analog converter of 1-bit digital input in sampling phase according to an embodiment. FIGS. 7A-7C, as discussed above, are the 1-bit digital input equivalent circuits of circuits 100, 200, 500, and 600 during sampling phase.

Figure 8A:
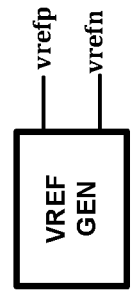
FIGS. 8A-8B are circuit diagrams of equivalent circuits of a 12-bit digital-to-analog converter in sampling phase according to an embodiment.
Figure 8A:
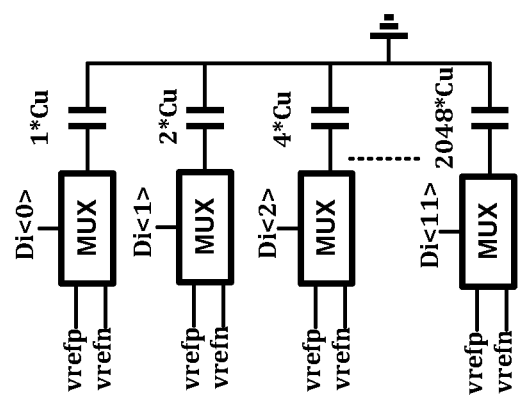
Figure 8B:
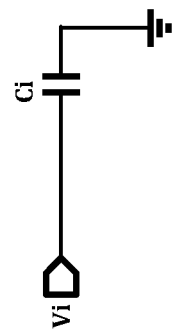

FIGS. 8A-8B are circuit diagrams of equivalent circuits of a 12-bit digital-to-analog converter in sampling phase according to an embodiment. FIG. 8A is a 12-bit digital input equivalent circuit representing circuits 100, 200, 500, and 600 each coupled with one or more parallel arrays of 12-pair binary-weighted linear capacitors in sampling phase as described above. FIG. 8B is another equivalent circuit representing circuits 100, 200, 500, and 600 each coupled with one or more parallel arrays in sampling phase. In some embodiments, $Ci=2^N*Cu$. N=1 when the digit of input is 1 bit. N=12 when the digit of input is 12 bits.

Figure 9:
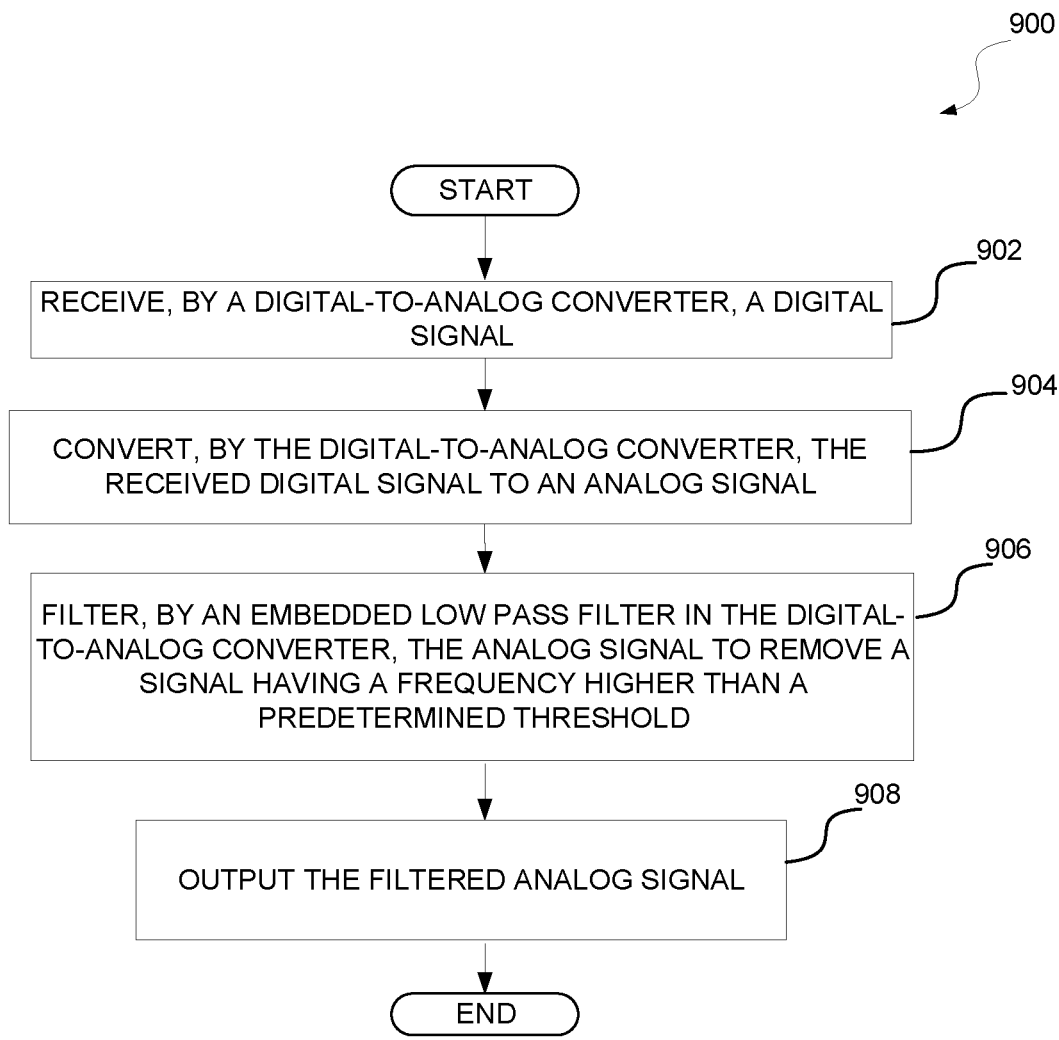
FIG. 9 is a flow diagram illustrating a method of generating analog signals via a low pass filter embedded digital-to-analog converter according to an embodiment.

FIG. 9 is a flow diagram illustrating a method of generating an analog signal via a low pass filter embedded digital-to-analog converter according to an embodiment. In some embodiments, in operation 902, a digital-to-analog converter, such as a fully differential signal outputting digital-to-analog converter, or a single-ended signal outputting digital-to-analog converter, receives a digital signal. The digital signal may be a 1-bit digital signal or an N-bit digital signal, such as a 12-bit digital signal. In operation 904, the digital-to-analog converter converts the received digital signal to an analog signal via a sampling phase and a conversion phase as recited above. In operation 906, an embedded low pass filter in the digital-to-analog converter filters the converted analog signal to remove a signal having a frequency higher than a predetermined threshold, such as a cut-off frequency. In operation 908, the digital-to-analog converter outputs the filtered analog signal. A person of ordinary skill in the art will appreciate that the function of a low pass filter is to allow signals of a given band of frequencies to pass unaltered while attenuating or weakening other frequencies that are unwanted. In the present application, the predetermined threshold corresponding to the cut-off frequency may be defined by adjusting the value of Cf in circuits 500 and 600, and may be defined by adjusting the value of the second capacitor C2 in circuits 100 and 200.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present disclosure. Moreover, features of one embodiment may be incorporated into other embodiments, even where those features are not described together in a single embodiment within the present document. Accordingly, the disclosure is described by the appended claims.

What is claimed is:

1. A circuit, comprising:
    a first switch coupled to a first node that is coupled to a fourth switch and a first parallel array of binary-weighted linear capacitors;
    a second switch coupled to a first voltage of common mode and a second node that is coupled to the first parallel array and a third switch;
    a positive input port of a second operational amplifier coupled to a third node that is coupled to the third switch and a second capacitor;
    a negative output port of the second operational amplifier coupled to a fourth node that is coupled to the second capacitor and the fourth switch;
    a fifth switch coupled to a fifth node that is coupled to a second parallel array of binary-weighted linear capacitors and an eighth switch;
    a sixth switch coupled to the first voltage of common mode and a sixth node that is coupled to the second parallel array and a seventh switch;
    a negative input port of the second operational amplifier coupled to a seventh node that is coupled to the seventh switch and a fourth capacitor; and
    a positive output port of the second operational amplifier coupled to an eighth node that is coupled to the fourth capacitor and the eighth switch;
    wherein the first parallel array and the second capacitor are in series; wherein the second parallel array and the fourth capacitor are in series; and wherein the first parallel array and second parallel array are in parallel with each other.

2. The circuit in claim 1, wherein a second voltage of common mode is coupled between the positive input port and the negative input port of the second operational amplifier.

3. The circuit in claim 1, wherein the circuit is a 12-bit digital-to-analog converter.

4. The circuit in claim 1, wherein the circuit is a fully differential analog signal outputting digital-to-analog converter.

5. A method, comprising:
    receiving, by a digital-to-analog converter, a digital signal;
    converting, by the digital-to-analog converter, the received digital signal to an analog signal;

filtering, by an embedded low pass filter in the digital-to-analog converter, the analog signal to remove a signal having a frequency higher than a predetermined threshold; and outputting the filtered analog signal;

wherein the converter comprises:

a first switch coupled to a first node that is coupled to a fourth switch and a first parallel array of binary-weighted linear capacitors;

a second switch coupled to a first voltage of common mode and a second node that is coupled to the first parallel array and a third switch;

a positive input port of a second operational amplifier coupled to a third node that is coupled to the third switch and a second capacitor;

a negative output port of the second operational amplifier coupled to a fourth node that is coupled to the second capacitor and the fourth switch;

a fifth switch coupled to a fifth node that is coupled to a second parallel array of binary-weighted linear capacitors and an eighth switch;

a sixth switch coupled to the first voltage of common mode and a sixth node that is coupled to the second parallel array and a seventh switch;

a negative input port of the second operational amplifier coupled to a seventh node that is coupled to the seventh switch and a fourth capacitor; and a positive output port of the second operational amplifier coupled to an eighth node that is coupled to the fourth capacitor and the eighth switch;

wherein the first parallel array and the second capacitor are in series; wherein the second parallel array and the fourth capacitor are in series; and wherein the first parallel array and second parallel array are in parallel with each other.

6. The method of claim 5, wherein a second voltage of common mode is coupled between the positive input port and the negative input port of the second operational amplifier.

7. The method of claim 5, wherein a first parallel array of binary-weighted linear capacitors is coupled between the first node and the second node, a second parallel array of binary-weighted linear capacitors is coupled between the fifth node and the sixth node.

8. The method of claim 5, wherein the digital-to-analog converter is a 12-bit digital-to-analog converter.

9. The method of claim 5, wherein the digital-to-analog converter outputs a fully differential analog signal.

* * * * *